(12) United States Patent
Reedy et al.

(10) Patent No.: US 8,420,926 B1
(45) Date of Patent: Apr. 16, 2013

(54) HYBRID SOLAR CELL INTEGRATING PHOTOVOLTAIC AND THERMOELECTRIC CELL ELEMENTS FOR HIGH EFFICIENCY AND LONGEVITY

(75) Inventors: Robert Martin Reedy, Auburndale, FL (US); Nicoleta Sorloaica-Hickman, Orlando, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 355 days.

(21) Appl. No.: 12/243,431

(22) Filed: Oct. 1, 2008

Related U.S. Application Data

(60) Provisional application No. 60/976,987, filed on Oct. 2, 2007.

(51) Int. Cl.
*H02N 6/00* (2006.01)
*H01L 31/042* (2006.01)

(52) U.S. Cl.
USPC ........................................................ 136/248

(58) Field of Classification Search .................... 136/248
See application file for complete search history.

(56) References Cited

U.S. PATENT DOCUMENTS

| | | | | |
|---|---|---|---|---|
| 4,002,031 A | * | 1/1977 | Bell | 60/641.15 |
| 4,063,963 A | * | 12/1977 | Bond, Jr. | 136/244 |
| 4,106,952 A | * | 8/1978 | Kravitz | 136/206 |
| 4,470,263 A | * | 9/1984 | Lehovec et al. | 62/3.5 |
| 4,710,588 A | | 12/1987 | Ellion | |
| 4,773,945 A | * | 9/1988 | Woolf et al. | 136/256 |
| 5,320,685 A | * | 6/1994 | Hilgarth et al. | 136/259 |
| 5,353,600 A | * | 10/1994 | Merritt et al. | 62/3.7 |
| 6,162,985 A | * | 12/2000 | Parise | 136/201 |
| 6,407,328 B2 | * | 6/2002 | Kleinwachter | 136/246 |
| 6,717,045 B2 | * | 4/2004 | Chen | 136/246 |
| 6,806,415 B2 | * | 10/2004 | Fujisaki et al. | 136/259 |
| 2004/0112417 A1 | * | 6/2004 | Rastegar et al. | 136/205 |
| 2009/0014057 A1 | * | 1/2009 | Croft et al. | 136/248 |

FOREIGN PATENT DOCUMENTS

| GB | 2321338 | * | 7/1998 |
|---|---|---|---|
| KR | 10-2006-0095903 | * | 9/2005 |

OTHER PUBLICATIONS

A. Luque and S. Hegedus, Handbook of Photovoltaic Science and Engineering, 2003, John Wiley and ons, Ltd., p. 375.*
Machine Translation of KR10-2006-0095903, Lee, Chan-Jae, Sep. 5, 2006.*
Rowe, D.M., CRC Handbook of Thermoelectrics, 1995, CRC Press LLC, p. 653.*

* cited by examiner

*Primary Examiner* — Jonathan Johnson
*Assistant Examiner* — Tamir Ayad
(74) *Attorney, Agent, or Firm* — Brian S. Steinberger; Phyllis K. Wood; Law Offices of Brian S. Steinberger, P.A.

(57) ABSTRACT

Methods, systems and apparatus for a solar cell integrating photovoltaic and thermoelectric cell elements to form a hybrid solar cell. The cell has increased efficiency and longevity by combining operations of the photovoltaic and thermoelectric elements in at least three different modes of operation to increase electrical output per unit of panel area and to increase cell life, improve performance, and provide operational benefits under different environmental conditions.

5 Claims, 3 Drawing Sheets

HYBRID SOLAR CELL INTEGRATING PHOTOVOLTAIC AND THERMOELECTRIC CELL ELEMENTS FOR HIGH EFFICIENCY AND LONGEVITY

This application claims the benefit of priority to U.S. Provisional Application No. 60/976,987 filed on Oct. 2, 2007.

FIELD OF THE INVENTION

This invention relates to solar cells and, in particular, to methods, apparatus and systems for a hybrid solar cell integrating photovoltaic and thermoelectric cell elements, wherein the thermoelectric cell element is used to cool and heat the photovoltaic element directly to increase the photovoltaic performance and the thermoelectric cell material is optimized to convert heat dissipated by the photovoltaic element into useful electric energy. Photovoltaic.

BACKGROUND AND PRIOR ART

Semiconductor solar cells are utilized to convert light energy to useable electrical voltages and currents through the photovoltaic effect. Briefly, a typical semiconductor solar cell includes an interface between n-type and p-type transparent semiconductor materials. Light shining on the semiconductor materials adjacent the interface creates hole-electron pairs in addition to those otherwise present, and the minority charge carriers migrate across the interface in opposite directions. There is no compensating flow of majority carriers, so that a net electrical charge results. A useful electrical current is then obtained in an external electrical circuit by forming ohmic contacts to the materials on either side of the interface.

In general terms, a photovoltaic solar cell is fabricated by depositing or attaching the appropriate semiconductor layers onto a substrate, and then adding additional components to complete the cell. The individual solar cells are connected together into large arrays to deliver power of the desired voltage and current. The ratio of power output to area of the solar cell array is an important design parameter, since the required power output could in principle be satisfied, for example, by larger numbers of low power density solar cells made of silicon or by smaller numbers of high power density solar cells made of gallium arsenide. Large numbers of solar cells require more supporting structure and area with solar access (such as the scarce area on rooftops) adding cost and complexity to PV system, and reducing the amount of energy which can be generated on a given site, such as a building or plot of land.

A number of the individual solar cells are connected together in an array, typically by fastening the solar cells to a support structure and then electrically interconnecting the cells into series and parallel arrangements, as necessary to meet the power requirements. This incentive for improved power output and area reduction is particularly pressing for crystalline solar cells such as mono-crystalline silicone solar cells, which have higher power output per unit area than thin-film solar cells, but continue to be at a disadvantage in cost per unit area, because of their manufacturing requirements.

The power output for most solar cells decreases significantly with increased cell temperature, with about a 0.4-0.5% loss for every degree Celsius. This drop in output power is mainly due to the characteristic open circuit voltage, which decreases by about 0.4%/° C. from increased recombination in the semiconductor stemming from the greater prevalence of phonons at higher temperatures. Under standard conditions of one sun—1000 W/m$^2$ solar illumination, the typical solar cell operating temperature may increase 30-40° C.—so this negative effect can cause a significant power loss of about 15-20%. During the winter (in northern climates) the PV panels are exposed to extreme temperature conditions, and potential snow and ice buildup. For these reasons, thermal management is an important consideration for any PV system. Nearly every negative mechanism (oxidation, delamination, encapsulation failure) is accelerated by high or low temperatures, sometimes exponentially with temperature.

U.S. Pat. No. 4,710,588 issued in Dec. 1, 1986 discloses a solar cell that generates an electrical voltage with contributions from both photovoltaic and thermoelectric effects, when a high thermal gradient is impressed across a semiconductor p/n solar cell. To achieve a substantial thermoelectric voltage contribution, the front side of the solar cell is heated to an elevated temperature consistent with efficient operation of the photovoltaic mechanism of the solar cell, and the back side of the solar cell is cooled to a lower temperature. Significantly, this configuration uses a discrete TE element physically attached to the back of a complete and discrete PV cell (contrast with the completely integrated PV-TE cell disclosed herein). The magnitude of the thermoelectric voltage contribution is increased by reducing the coefficient of thermal conductivity of the solar cell material, by using face electrodes having the proper thermoelectric potentials in contact with the solar cell material, by increasing the light intensity and then the heat input to the front side of the solar cell, and by cooling the back side of the solar cell.

A significant amount of development of Photovoltaic/Thermal (PV/T) modules is known. One provides a combination photovoltaic array and solar thermal water heater. A first problem with this configuration is the requirement for a nearby thermal heat requirement, such as heating water. By far, most PV installations are not associated with a heat requirement. Consider the many arrays mounted on office buildings, warehouses, or simply ground mounted. However, even if such a heat load is present, when the water heater component has stored all the hot water possible, such as during a day when there is no use, the water temperature is so high as to render its cooling effect on the photovoltaic module useless. In fact, the module can remain at high temperature when it would otherwise cool down with the evening ambient decline. Another problem with conventional photovoltaic/thermal is its focus on water heating, which can lead to significant temperature gradients across the array, with corresponding thermal stresses. Photovoltaic solar cells having a component for reducing heat to increase the output power have been limited to rejection of the photovoltaic heat to domestic or process water heating. Further problems with this type of cooling include the fact that the cooling effect is often negligible, allowing unacceptable thermal cycling stress on all components and that the thermal load requirements do not allow for optimum design of the electric generation system due to the variability of operating conditions.

Thus, there is a continuing need for an integrated hybrid solar cell that integrates photovoltaic and thermoelectric cell elements to increase the ratio of power output to area for solar cells and solar cell arrays and that operates in different ambient weather conditions with increased efficiency and longevity. The present invention fulfills this need, and further provides related advantages.

SUMMARY OF THE INVENTION

A primary objective of the invention is to provide methods, apparatus and systems for combining photovoltaic and thermoelectric elements to increase electrical output per unit of panel area.

A secondary objective of the invention is to provide methods, apparatus and systems for a hybrid solar cell having a mode of operation that uses the heat generated from absorbed solar energy and other heat generating processes, along with a thermoelectric cell configured between this "hot side" and a colder ambient, thus generating additional electric energy which, when added to the photovoltaic cell output, increases the efficiency per unit area by a significant amount.

A third objective of the invention is to provide methods, apparatus and systems for a hybrid solar cell having an operational mode that uses the thermoelectric cell as a Peltier Effect cooler to cool the photovoltaic cell itself, effectively increasing the output power of the photovoltaic cell under typical warm weather conditions, such as found on a rooftop.

A fourth objective of the invention is to provide methods, apparatus and systems for a hybrid solar cell having an operational mode for use on days having a combination of sun and weather conditions that dictate differing responses to optimize the system output by switching between modes of operation. A specific intention of this objective is to provide thermal management within the very structures of photovoltaic cells operating in conditions of more than one sun (Concentrating PV).

A fifth objective of the invention is to provide methods, apparatus and systems for a hybrid solar cell having a mode of operation in cold climates wherein the thermoelectric cell is driven in reverse as a thermoelectric heater to increase cell life and protect the photovoltaic cell during periods of extreme cold by preventing cell temperatures from reaching a very low point, only to be increased dangerously fast by the early morning sun. In addition to protection of the cell structure and materials from such rapid thermal change, this mode will prevent the phenomenon of "startup overvoltage" when the early morning sun hits a very cold cell, causing the output voltage to go dangerously high and allowing for more efficient matching of the array design with the inverter voltage characteristics.

A sixth objective of the invention is to provide methods, apparatus and systems for a hybrid solar cell having a mode of operation in cold climates wherein the thermoelectric cell is driven in reverse as a thermoelectric heater to prevent buildup of snow and ice, which renders PV systems inoperable for long periods of time without expensive and damaging manual de-icing procedures, or a separate heating infrastructure.

A first embodiment provides a method of producing a hybrid solar cell having an increased electric output. The method includes providing photovoltaic cell elements, providing thermoelectric cell elements coupled with the photovoltaic cell elements as a hybrid solar cell and operating the thermoelectric cell elements in an operational mode to efficiently increase the electric output and increase the longevity of the hybrid solar cell.

The operational modes can include operating the hybrid solar cell in a first mode of operation using heat generated from absorbed solar energy and other heat generating processes, including ohmic heat from current flow through the photovoltaic cell elements and connections with the thermoelectric cell elements configured between this "hot side" and a colder ambient, to produce electric energy and combining the electric output of the thermoelectric cell elements and the photovoltaic cell elements to increase the power output of the hybrid solar cell. The operational modes can also include operating the thermoelectric cell elements in a second mode of operation with the thermoelectric cell elements configured as a Peltier Effect cooler driven by the DC output of the PC system to cool the photovoltaic cell elements to increase the net output power of the hybrid solar cell under typically hot conditions. The operational modes can also include sensing an external environmental condition and operating the hybrid solar cell in a third mode of operation alternating between the first and the second modes of operation based on the external environmental conditions, for the purpose of increasing the net output power of the hybrid cell, or for other operating advantages.

A second embodiment provides a hybrid solar cell that includes a photovoltaic cell, a thermoelectric cell coupled with the photovoltaic cell and at least two modes of operation to efficiently increase the electric output and increase the longevity of the hybrid solar cell. The photovoltaic cell includes a first layer for allowing solar light to enter the photovoltaic cell, an anti-reflective layer adjacent to the first layer, a n-type semiconductor layer, a p-type semiconductor layer adjacent to the n-type semiconductor layer, a first conductive layer sandwiched between the anti-reflective layer and one of the n-type and p-type semiconductor elements and a second conductive layer sandwiched between the anti-reflective layer and an opposite one of the n-type and p-type semiconductor elements. The hybrid solar cell can include an insulating layer between the photovoltaic cell and the thermoelectric cell.

The thermoelectric cell includes a n-type semiconductor layer, a p-type semiconductor layer adjacent to the n-type semiconductor layer, a first connector layer sandwiched between the insulating layer and one of the n-type and p-type semiconductor elements and a second connector layer sandwiched between the insulating layer and an opposite one of the n-type and p-type semiconductor elements.

The modes of operation includes a first mode of operation using heat generated from absorbed solar energy and other heat generating processes, including ohmic heat from current flow through the photovoltaic cell elements and connections with the thermoelectric cell elements configured between this "hot side" and a colder ambient, to produce electric energy. The modes of operation also includes a second mode of operation with the thermoelectric cell elements configured as a Peltier Effect cooler driven by the DC output of the PC system to cool the photovoltaic cell elements to increase the net output power of the hybrid solar cell under typically hot conditions. Optionally, the at least two modes of operation further includes a sensing device for sensing an external environmental condition, a controller connected with the sensing device and hybrid solar cell for controlling an operation of the hybrid solar cell and a third mode of operation alternating between the first and the second modes of operation based on the external environmental conditions, for the purpose of increasing the net output power of the hybrid cell, or for other operating advantages.

Further objects and advantages of this invention will be apparent from the following detailed description of preferred embodiments which are illustrated schematically in the accompanying drawings.

DESCRIPTION OF THE PREFERRED EMBODIMENTS

Figure 1:
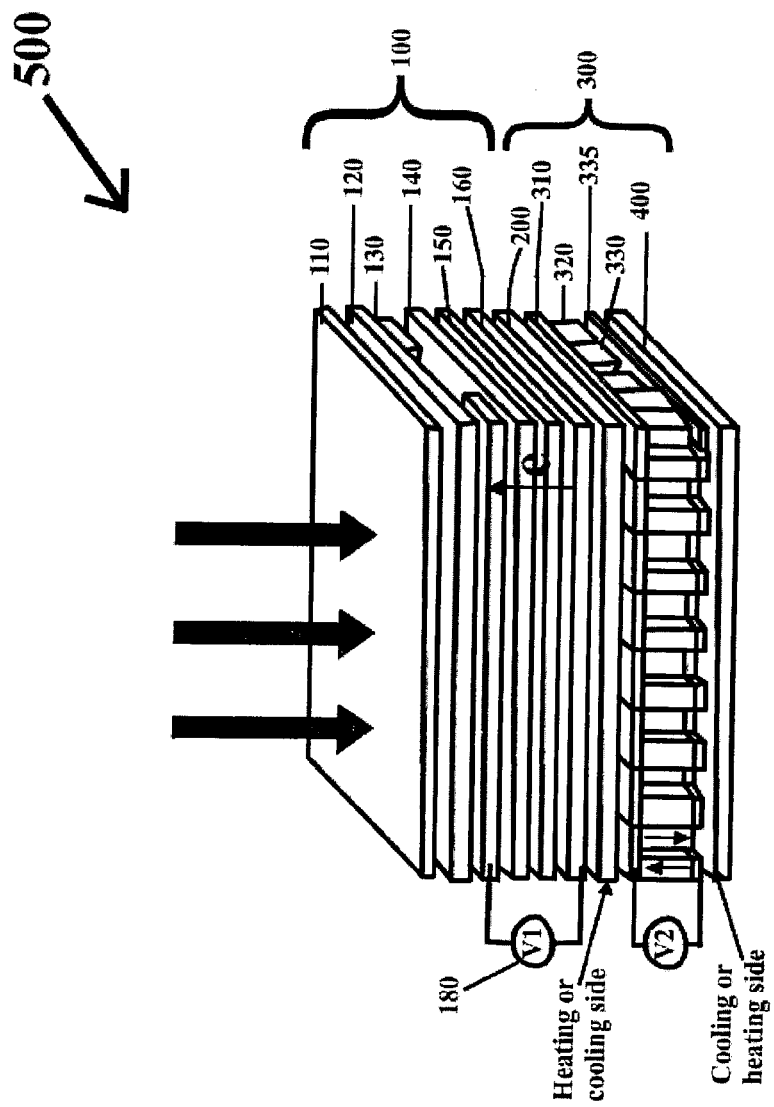
FIG. 1 is a schematic of a photovoltaic and thermoelectric hybrid cell.

Before explaining the disclosed embodiments of the present invention in detail it is to be understood that the invention is not limited in its application to the details of the particular arrangements shown, since the invention is capable of other embodiments. Also, the terminology used herein is for the purpose of description and not of limitation.

The following is a list of the reference numbers used in the drawings and the detailed specification to identify components:

| 100 | PV cell | 310 | top connector |
| --- | --- | --- | --- |
| 110 | glass layer | 320 | n-type semiconductor layer |
| 120 | anti-reflective layer | 330 | p-type semiconductor layer |
| 130 | electric contact | 335 | bottom connector |
| 140 | n-type semiconductor layer | 400 | bottom insulating layer |
| 150 | p-type semiconductor layer | 500 | hybrid solar cell |
| 160 | contact plate | 600 | solar system |
| 200 | insulating layer | 610 | conditioner/controller |
| 300 | TE cell | 620 | PV cells |
| 625 | TE cells | 640 | sensing device |
| 630 | power source | | |

The methods, systems and apparatus of the present invention provides a unique application of photovoltaic and thermoelectric cells to form a hybrid solar cell having increased efficiency and longevity by combining photovoltaic (PV) and thermoelectric (TE) elements in at least three possible modes of operation to increase electrical output pet unit of panel area. Other benefits are also expected with this approach, particularly increased cell life and improved performance in areas of cold, snow and ice. In one embodiment, the method of cell integration backs the photovoltaic module with a corresponding thermoelectric cell and in another embodiment the integration involves complex manipulation of nanostructures.

FIG. 1 is a schematic of a photovoltaic and thermoelectric hybrid cell 500. As shown, the photovoltaic and thermoelectric hybrid cell 500 includes a photovoltaic cell 100 and thermoelectric element 300 separated by an insulating layer 200. The TE element 300 is sandwiched between the top insulating layer 200 and a bottom insulating layer 400. The thermoelectric module of the TE element 300 is sandwiched between a top contact layer 310 and a bottom contact layer 335.

In the PV cell 100, sunlight passing through the glass 110 and anti-reflective layer 120 directly below the glass layer 110 strikes the p-type silicon layer 150, releasing free electrons from the silicon atoms in the p-type silicon layer 150. The electrons are attracted to the positively-charged n-type silicon layer 140. Connecting the cell to an electrical circuit 180 through the electrical contacts 160 provides electrical energy at electrical contacts 130 and electrical contact plate 160 to drive a load. The thermoelectric module consists of an array of semiconductor pellets that have been "doped" so that one type of charge carrier—either positive or negative—carries the majority of current. The pairs of p/n pellets 320 and 330 are configured so that they are connected electrically in series, but thermally in parallel.

When a small DC voltage is applied to the module, the positive 330 and negative 320 charge carriers in the pellet array absorb heat energy from one substrate 200 and 400 surface and release it to the substrate at the opposite side. The surface where heat energy is absorbed becomes cold; the opposite surface where heat energy is released becomes hot. Further, when a temperature gradient is imposed across the thermoelectric device 300, a DC voltage develops across the terminals 310 and 335. When a load is properly connected, electrical current flows as shown by the arrows in the n-type semiconductor layer 320 and the p-type semiconductor layer 320.

Figure 2A:
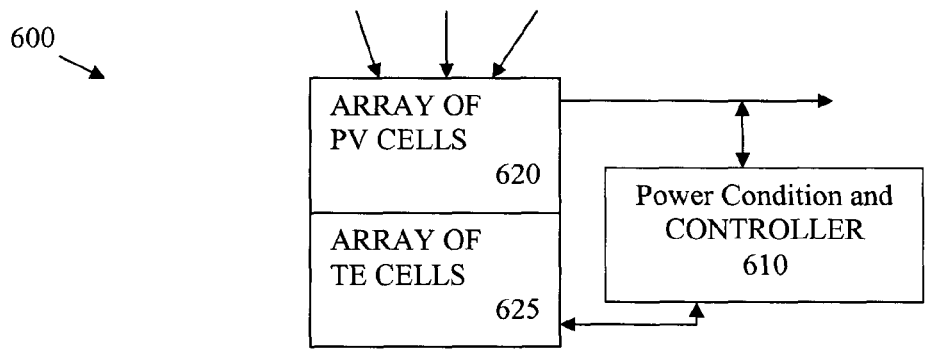
FIG. 2a is a block diagram showing an array of photovoltaic cells and thermoelectric cells hybrid solar cells in a first mode of operation.
Figure 2B:
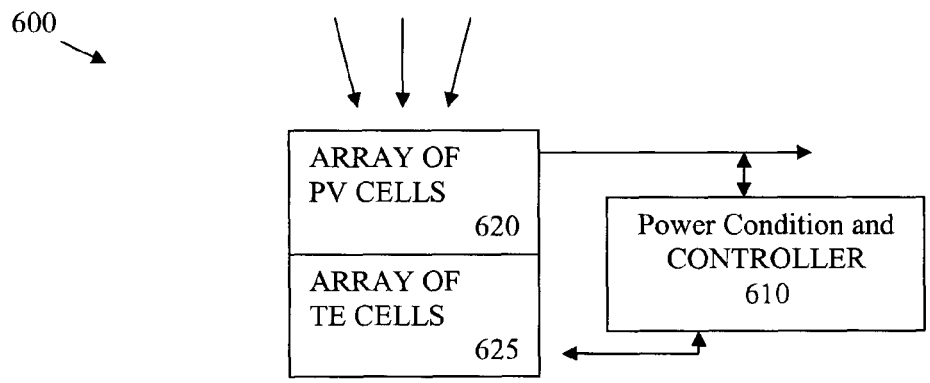
FIG. 2b is a block diagram showing an array of photovoltaic cells and thermoelectric cells hybrid solar cells in a second mode of operation.
Figure 2C:
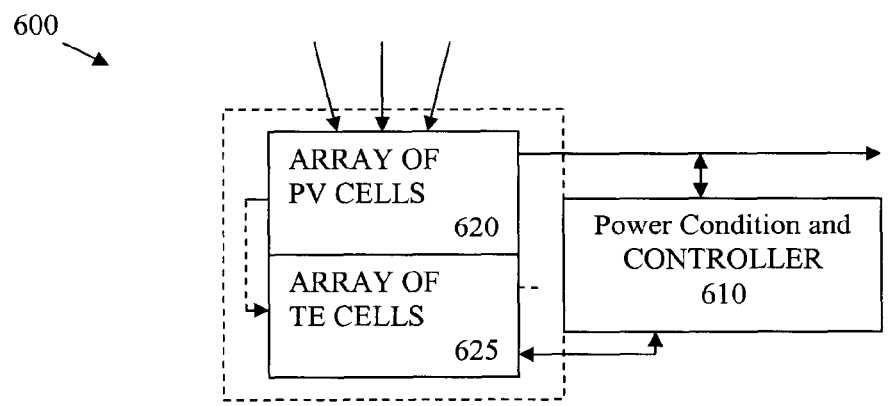
FIG. 2c is a block diagram showing an array of photovoltaic cells and thermoelectric cells hybrid solar cells in a third mode of operation.

FIGS. 2a through 2c are schematic block diagrams of a solar system 600 using the hybrid solar cell in three different modes of operation. The system 600 includes an array of PV cells 620, an array of TE cells 625, and a power conditioner and controller 610. In a preferred embodiment, the solar system includes a sensing device 640 for sensing an environmental conditions and a power source 630.

A first mode of operation shown in FIG. 2a uses the heat generated from absorbed solar energy and other heat generating processes, such as the ohmic heat from current flow through the photovoltaic cells 620 and connections. When a thermoelectric cell 625 is configured between this "hot side" and a colder ambient, electric energy is produced as described by the Seebeck Effect increases the electric produced by the TE cell 625. The Seebeck Effect states that if an electrical current is present in a series circuit of two dissimilar materials, provided the junctions of the two materials are at different temperatures. Optimization of materials used for the TE cell 625 contacts increases the electric energy produced by the TE cell 625. When the electric produced in the thermoelectric cell 625 is added to the electric produced by the photovoltaic cell 620, the hybrid solar cell 500 becomes more efficient by approximately 7% in a preliminary calculation.

The second mode of operation, shown in FIG. 2b, uses the thermoelectric cell 625 as a Peltier Effect cooler, driven by the DC output of the PV 620 system to cool the photovoltaic cell 620 to effectively increase the output power of the photovoltaic cell 620 under typical warm weather, rooftop conditions. Photovoltaic cells suffer a significant decline in output voltage, and therefore power and energy, with increase in cell temperature. For example, crystalline silicon solar cells decline approximately 0.5% in output power for every degree Centigrade increase in cell temperature. Even in cool weather, a cell typically runs at 50-70 degrees C. during the full sun that often occurs in the middle of the day. Preliminary analysis of one representative combination yields an increase of approximately 10% in total output power, the net of the power needed to drive the thermoelectric cooler, of the hybrid solar cell. Reversing the current, the thermoelectric cell 625 can be used in cold climates to heat up the PV cell 620 for protection against extremes, as well as prevent the snow and ice buildup.

The third mode of operation, shown in FIG. 2c, is available when there is a combination of sun and other weather conditions that require a different, or combination of responses to optimize the system 600 output. For example, on a very cold sunlit day, it is best to operate the hybrid solar cell in the first mode. On hot days, operation in the second mode is most efficient. At other times, the weather changes and requires operation to switch between the modes or to vary the mode-three cooling energy. For example, consider the first hours of operation on a typical morning before the module heats significantly, it may make sense to operate in the hybrid solar cell in the first mode and then switch to the second mode, at an increasing drive power, as the temperature of the hybrid solar cell increases.

A special case for third mode of operation occurs in cold climates by driving the thermoelectric cooler in reverse from an external grid-sourced DC supply so it becomes a thermoelectric heater. During extremely cold nights, the hybrid solar cell is protected from thermal stress by warming the hybrid solar cell with the thermoelectric element, and to keep the photovoltaic cell free of snow and ice, which is a significant detriment to photovoltaic systems in cold, wet climates.

Figure 3:
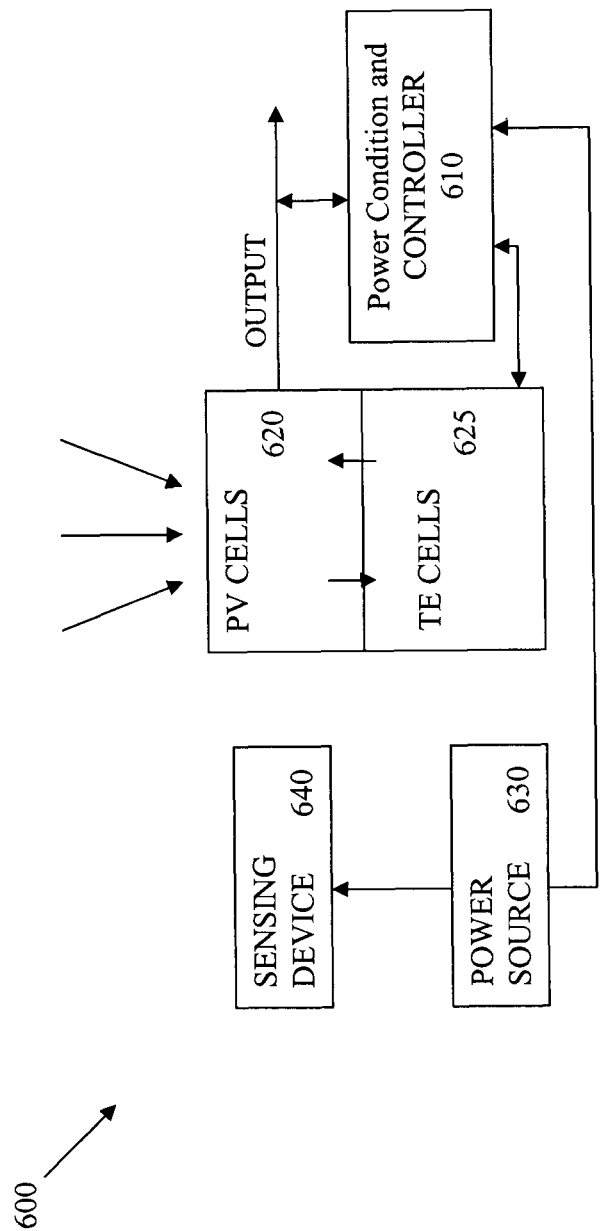
FIG. 3 is a block diagram of an example of a composite PV/TE hybrid solar cell system, configured for all modes of operation, including night-time heating of a cold cell.

FIG. 3 is a block diagram of an example of a preferred embodiment of a PV/TE hybrid solar cell system 600. The hybrid solar cell of the present invention provides appropriate electrical connections for receiving electric energy from the PV cells 620, and receiving or delivering electric energy to the TE cells 625, a power conditioner and controller 610 connected with the hybrid cell provides appropriate control of the mode of operation of the TE cells 625 to optimize the combined power output of the Hybrid Cell, and provide other benefits such as nighttime heating of the unit; and optionally provides a grid-sourced DC power supply 630, with control 610, such as a rectified AC feed from the output side of the inverter. This source would be used for nighttime warming of the Hybrid module.

Effective application of these techniques is expected to increase net cell efficiency by 8-10%, based on preliminary calculations of simple constructions of PV/TE combinations under average ambient conditions without optimization of materials, construction or mode of operation. With optimization of the materials, construction or mode of operation the expected net increase could reach 15%. Major efforts and millions of dollars are going to the effort to improve PV cell efficiency by just a few percent. Even though the overall improvement in efficiency is net of any energy required to drive the thermoelectric cooler in the second mode of operation, these techniques can bring an average improvement in photovoltaic systems output of 10%. If the resulting designs are found to be economic (less than approximately 10% more capital in this example), and practical, the work could bring a significant drop in photovoltaic system installation costs per kW and delivered energy costs (in cents/kWh).

Furthermore, the single greatest contributor to the physical end-of-life for any cell is prolonged operation at these high temperatures. Most negative mechanisms including oxidation, delamination and encapsulation failure are accelerated by high temperatures—exponentially in some cases. Operation in the second mode reduces these temperatures, and the third mode of operation reduces the net thermal cycling from very cold to very hot temperatures.

With a simple control system 610 and the AC-supply 630 option, the third mode of operational advantages is brought to bear on very cold nights to maintain the array at an approximately constant temperature, and prevent excessive thermal stresses on the contacts, modules, encapsulation, and other elements of the expensive array. Again, module reliability will be increased and life will be extended. Furthermore, snow and ice could be melted from the surface of the array, allowing photovoltaic output that would otherwise be lost on those bright clear days after a snow. And the array voltages can be managed effectively on "cold morning startup", allowing for better utilization of the most efficient inverter voltage operating regimes.

In summary, the methods, apparatus and systems of the present invention provide a hybrid solar cell integrating photovoltaic and thermoelectric cell elements The TE element is used to cool and heat the PV element directly, without intervening layers of structural backing material, effectively increasing the PV performance in real-world conditions. Conversely, the TE material is optimized to convert heat dissipated by the PV element into useful electric energy, particularly in locations where the PV cell experiences a large temperature gradient. In this case the TE module is used for cooling, heating and energy generation depending on the ambient conditions.

In summary, a first embodiment provides a method of producing a hybrid solar cell having an increased electric output. The method includes providing photovoltaic cell elements, providing thermoelectric cell elements coupled with the photovoltaic cell elements as a hybrid solar cell, a controller for controlling an operational mode of the hybrid solar cell and operating the thermoelectric cell elements in an operational mode to efficiently increase the electric output and increase the longevity of the hybrid solar cell.

The operational modes can include operating the hybrid solar cell in a first mode of operation using heat generated from absorbed solar energy and other heat generating processes, including ohmic heat from current flow through the photovoltaic cell elements and connections with the thermoelectric cell elements configured between this "hot side" and a colder ambient, to produce electric energy and combining the electric output of the thermoelectric cell elements and the photovoltaic cell elements to increase the power output of the hybrid solar cell. The operational modes can also include operating the thermoelectric cell elements in a second mode of operation with the thermoelectric cell elements configured as a Peltier Effect cooler driven by the DC output of the PC system to cool the photovoltaic cell elements to increase the net output power of the hybrid solar cell under typically hot conditions. The operational modes can also include sensing an external environmental condition and operating the hybrid solar cell in a third mode of operation alternating between the first and the second modes of operation based on the external environmental conditions, for the purpose of increasing the net output power of the hybrid cell, or for other operating advantages.

A second embodiment provides a hybrid solar cell that includes a photovoltaic cell, a thermoelectric cell coupled with the photovoltaic cell and at least two modes of operation to efficiently increase the electric output and increase the longevity of the hybrid solar cell. The photovoltaic cell includes a first layer for allowing solar light to enter the photovoltaic cell, an anti-reflective layer adjacent to the first layer, a n-type semiconductor layer, a p-type semiconductor layer adjacent to the n-type semiconductor layer, a first conductive layer sandwiched between the anti-reflective layer and one of the n-type and p-type semiconductor elements and a second conductive layer sandwiched between the anti-reflective layer and an opposite one of the n-type and p-type semiconductor elements. The hybrid solar cell can include an insulating layer between the photovoltaic cell and the thermoelectric cell. The thermoelectric cell includes a n-type semiconductor layer, a p-type semiconductor layer adjacent to the n-type semiconductor layer, a first connector layer sandwiched between the insulating layer and one of the n-type and p-type semiconductor elements and a second connector layer sandwiched between the insulating layer and an opposite one of the n-type and p-type semiconductor elements.

A third embodiment provides a solar system includes a hybrid solar cell consisting of a photovoltaic cell coupled with a thermoelectric cell coupled with the photovoltaic cell and separated by an insulating layer and at least two modes of operation to efficiently increase the electric output and increase the longevity of the hybrid solar cell. The system can include a sensing device for sensing an external environmental condition and a controller connected with the sensing device and hybrid solar cell for controlling the at least two modes of operation. The at least two modes of operation for the third embodiment can include a first mode of operation using heat generated from absorbed solar energy and hybrid solar cell operation, including ohmic heat from current flow through the photovoltaic cell elements and connections with the thermoelectric cell elements configured between this "hot side" and a colder ambient, to produce electric energy. The modes of operation can also include a second mode of operation with the thermoelectric cell elements configured as a Peltier Effect cooler driven by the DC output of the photovoltaic cell to cool the photovoltaic cell elements to increase the net output power of the hybrid solar cell under typically hot conditions. The modes of operation can also include a third mode of operation alternating between the first and the second modes of operation based on the external environmental conditions, for the purpose of increasing the net output power of the hybrid cell, or for other operating advantages.

While the invention has been described, disclosed, illustrated and shown in various terms of certain embodiments or modifications which are presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

We claim:

1. A hybrid solar electric device consisting essentially of:
   a photovoltaic cell;
   a thermoelectric cell in direct physical and thermal contact to a substrate of the photovoltaic cell and integrally coupled with the photovoltaic cell to primarily cool and heat the photovoltaic cell;
   an electrical connection within the hybrid solar electric device between the photovoltaic cell and the thermoelectric cell for the thermoelectric cell to controllably receive electric energy from the photovoltaic cell to produce a reverse temperature gradient for cooling or a forward temperature gradient for heating;
   a sensing device to monitor an external environmental condition in which the hybrid solar device is operating; and
   a controller programmed to control at least three modes of operation of the photovoltaic cell and thermoelectric cell according to the output from the sensing device to efficiently increase the net electric output from the photovoltaic cell and increase the longevity of the hybrid solar electric device, one of the at least three modes of operation consisting of a first mode of operation with the thermoelectric cell elements configured as a Peltier Effect cooler driven by the DC output of the photovoltaic cell to primarily cool the photovoltaic cell elements to increase the net output power of the photovoltaic cell under sensed hot conditions and a second mode of operation wherein the thermoelectric cell elements are configured as a Peltier Effect cooler driven in reverse by one of the DC output of the photovoltaic cell and an external grid-sourced DC supply to heat the photovoltaic cell elements to protect from thermal stress of the hybrid solar electric device under sensed cold and wet environmental conditions; and a third mode of operation which alternates between the first and second modes of operation based on the external environmental condition for the purpose of increasing the output power of the hybrid solar electric device.

2. The hybrid solar electric device of claim 1, wherein the photovoltaic cell comprises:
   a first layer for allowing solar light to enter the photovoltaic cell;
   a anti-reflective layer adjacent to the first layer;
   a n-type semiconductor layer;
   a p-type semiconductor layer adjacent to the n-type semiconductor layer;
   a first conductive layer sandwiched between the anti-reflective layer and one of the n-type and p-type semiconductor elements; and
   a second conductive layer sandwiched between the anti-reflective layer and an opposite one of the n-type and p-type semiconductor elements.

3. The hybrid solar electric device of claim 2, wherein one of the photovoltaic cell and the thermoelectric cell includes:
   an electrically insulating and thermally conductive layer between the photovoltaic cell and the thermoelectric cell.

4. The hybrid solar electric device of claim 3, wherein the thermoelectric cell comprises:
   a n-type semiconductor layer;
   a p-type semiconductor layer adjacent to the n-type semiconductor layer;
   a first connector layer sandwiched between the insulating layer and one of the n-type and p-type semiconductor elements; and
   a second connector layer sandwiched between the insulating layer and an opposite one of the n-type and p-type semiconductor elements.

5. A composite PV/TE hybrid system consisting essentially of:
   a hybrid device consisting of a photovoltaic cell to produce an electrical output integrally coupled with a thermoelectric cell to primarily cool and heat the photovoltaic cell, the thermoelectric cell in direct physical and thermal contact to a thermally conductive substrate of the photovoltaic cell;
   an electrical connection between the photovoltaic cell and the thermoelectric cell for the thermoelectric cell to controllably receive electric energy from the photovoltaic cell;
   a sensing device for sensing an environmental condition;
   a controller connected with the sensing device and hybrid device electrical connection for automatically controlling an operational mode of the composite PV/TE hybrid system based on the sensed environmental condition;
   the controller programmed to control at least two modes of operation to efficiently increase the electric output of the photovoltaic cell and increase the longevity of the hybrid device, one of the at least two modes of operation with the thermoelectric cell elements configured as a Peltier Effect cooler driven by the DC output of the photovoltaic cell to cool the photovoltaic cell elements to increase the net output power of the hybrid device under sensed hot conditions and a second mode of operation to drive the thermoelectric cooler in reverse as a thermoelectric heater during sensed cold environmental conditions; and
   the controller programmed to control a third mode of operation alternating between the first and the second modes of operation based on the external environmental conditions, for the purpose of increasing the output power of the hybrid device.

* * * * *